United States Patent
Organ et al.

(10) Patent No.: US 11,302,412 B2
(45) Date of Patent: Apr. 12, 2022

(54) SYSTEMS AND METHODS FOR SIMULATED DEVICE TESTING USING A MEMORY-BASED COMMUNICATION PROTOCOL

(71) Applicant: Advantest Corporation, Tokyo (JP)

(72) Inventors: Donald Organ, San Jose, CA (US); Frank Liu, Jr., San Jose, CA (US)

(73) Assignee: Advantest Corporation, Tokyo (JP)

( * ) Notice: Subject to any disclaimer, the term of this patent is extended or adjusted under 35 U.S.C. 154(b) by 310 days.

(21) Appl. No.: 16/430,284

(22) Filed: Jun. 3, 2019

(65) Prior Publication Data
US 2020/0381071 A1    Dec. 3, 2020

(51) Int. Cl.
| | |
|---|---|
| G11C 29/38 | (2006.01) |
| G06F 13/16 | (2006.01) |
| G06F 13/42 | (2006.01) |
| G06F 13/00 | (2006.01) |
| G06F 30/20 | (2020.01) |

(52) U.S. Cl.
CPC .......... *G11C 29/38* (2013.01); *G06F 13/1668* (2013.01); *G06F 13/4282* (2013.01); *G06F 30/20* (2020.01); *G06F 2213/0026* (2013.01)

(58) Field of Classification Search
None
See application file for complete search history.

(56) References Cited

U.S. PATENT DOCUMENTS

| | | | | |
|---|---|---|---|---|
| 7,155,379 B2* | 12/2006 | Oshins | ................... | G06F 30/33 703/21 |
| 8,229,727 B2* | 7/2012 | Gupta | ..................... | G06F 30/33 703/23 |
| 9,454,636 B1 | 9/2016 | Subramaniam et al. | | |
| 9,910,689 B2 | 3/2018 | Nair | | |
| 10,295,596 B1* | 5/2019 | Ovadia | .......... | G01R 31/318307 |
| 10,719,644 B2* | 7/2020 | Sharma | ................. | G06F 30/331 |
| 2005/0251766 A1 | 11/2005 | Shah et al. | | |
| 2020/0026629 A1* | 1/2020 | Koothapaakkam | ..... | G06F 11/26 |

* cited by examiner

*Primary Examiner* — Justin R Knapp

(57) ABSTRACT

Embodiments of the present invention provide a method of simulating a memory-based communication protocol for testing a simulated device. The method includes storing data in known locations of a host data buffer, where the host data buffer is implemented in a shared memory space, executing instructions of a first program to store a command in the shared memory space using a data structure including an index, an ID, and a memory location, executing instructions of a second program to read the command from the host data buffer, access the data in the shared memory space to perform an operation defined by the ID using the data, where a location of the data is indicated by the index, and send a completion indicator to the first program after the operation is complete.

25 Claims, 9 Drawing Sheets

Indicates memory space on the host mapped to PCIe/MMIO address mapped to the controller (Not physical memory on host)

Indicates physical memory on host that is accessible by the controller

SYSTEMS AND METHODS FOR SIMULATED DEVICE TESTING USING A MEMORY-BASED COMMUNICATION PROTOCOL

FIELD

Embodiments of the present invention generally relate to the field of device testing. More specifically, embodiments of the present invention relate to methods and systems for simulating a device under test (DUT) during testing.

BACKGROUND

A device or equipment under test (DUT) is typically tested to determine the performance and consistency of the device before the device is sold. The device can be tested using a large variety of test cases, and the result of the test cases is compared to an expected output result. When the result of a test case does not match the expected output value, debugging is performed in an attempt to identify and correct any defects that result from the device.

A DUT is usually tested by automatic or automated test equipment (ATE), which may be used to conduct complex testing using software and automation to improve the efficiency of testing. The DUT may be a memory device or component that is intended to be integrated into a final product, such as a computer or other electronic device. Existing system level test software used in the NAND flash device development process specifically requires software to be tested and debugged after the development of the DUT is nearly complete. Even in an urgent case, the test program and the software product typically wait for the storage device provided by the customer to be ready for development and debugging, and therefore the productivity of the testing software development is constrained by the degree to which the device has been completed, which can lead to missed deadlines and products that must be launched before they are thoroughly tested.

Moreover, existing approaches to DUT testing are only able to modify certain properties of the DUT at a given time, and certain variations can only be tested in isolation. What is needed is a method for performing DUT testing that does not rely on the completion of the development of the device, that can improve the efficiency of production development by testing and debugging the testing software before the actual DUT is available, and that can be customized to test a vast number of variables to enhance the robustness and scalability of the testing.

SUMMARY

Embodiments of the present invention provide systems and methods for performing DUT testing that does not depend on the development of the device being complete, that can improve the efficiency of production development by testing and debugging the device simulated in software before the actual DUT is available, and that can be customized to test a vast number of variables to enhance the robustness and scalability of the testing. The testing can be performed at the API level according to the specification of the DUT. By performing testing and debugging earlier in the development process, less debugging and redesign is required when the actual device is available for testing, leading to an earlier delivery date of the device.

According to one embodiment, a method of simulating a memory-based communication protocol for testing a simulated device is disclosed. The method includes storing data in a host data buffer, where the host is a tester system, and where the host data buffer is implemented in a shared memory space, executing instructions of a tester system program to store a command in the shared memory space using a data structure including an index, an ID, and a memory location, executing instructions of a DUT simulation to read the command from the shared memory space, access a block of the shared memory space to perform an operation defined by the ID, where a location of the block of shared memory is indicated by the index, and send a completion indicator to the tester system program after the operation is complete.

According to some embodiments, the ID indicates that the command includes a program operation, where the access is reading the block to obtain data for writing to the memory location, where the operation includes performing the program operation, and further including the DUT simulation writing the data to a disk file responsive to the command.

According to some embodiments, the ID indicates that the command includes a read operation, where the access is storing data read from the memory location, where the operation includes performing the read operation, and further including executing instructions of the DUT simulation to access one or more disk files to read data at the memory location and store to the host data buffer in the block of shared memory.

According to some embodiments, the instructions of the tester system program and the instructions of the DUT simulation are executed as separate processes managed by a Linux-based operating system.

According to some embodiments, the method includes verifying the data after the operation to test the simulated device for errors after the program operation.

According to some embodiments, the verifying includes comparing the data to an expected result.

According to some embodiments, the command is stored in a base address register of the simulated device.

According to some embodiments, the instructions of tester program and the instructions of the DUT simulation are executed by a same processor.

According to some embodiments, the shared memory space includes memory-mapped files that emulate physical memory.

According to some embodiments, the memory-mapped files include files mapped using mmap.

According to some embodiments, the shared memory space includes memory-mapped files that emulate NAND flash memory.

According to some embodiments, the memory-based communication protocol utilizes a PCIe communication bus protocol.

According to another embodiment, a method of simulating a memory-based communication protocol for testing program operations of a simulated device is disclosed. The method includes storing data in a host data buffer, where the host data buffer is implemented in a shared memory space, executing instructions of a tester system program to store a program operation in the shared memory space using a data structure including a first index, an ID of the program operation, and a memory location, and executing instructions of a DUT simulation to, access the program operation in the shared memory space, read data from a block of the shared memory space defined by the first index, write the data to one or more disk files at the memory location, and send a first completion indicator to the tester system program after writing the data to the memory location. The method further includes executing instructions of the tester system program to store a read operation in the shared memory space using a data structure including a second index, an ID indicating that the read operation, and the storage location, and executing instructions of the DUT simulation to read the data from the memory location, write the data to a block of the host data buffer according to the second index, and send a second completion indicator to the tester system program after writing the data to the block defined by the second index.

According to some embodiments, the method includes verifying the data after the read operation to test the simulated device for errors, where the verifying includes comparing the data to an expected result.

According to some embodiments, the first completion indicator is stored in a queue managed by the tester system program.

According to some embodiments, the memory location references a memory location of a disk, and where the memory location is implemented as a disk file to simulate flash memory.

According to a different embodiment, a system for simulating a device under test is disclosed. The system includes a processor executing a Linux-based operating system and a memory in communication with the processor that provides a shared memory space for a tester system program and a DUT simulation program. Instructions of the tester system program and the DUT simulation program are executed by the processor, and the processor performs a method of simulating a memory-based communication protocol for testing a simulation of the device under test. The method includes storing data in a host data buffer, where the host is a tester system, and where the host data buffer is implemented in a shared memory space, executing instructions of the tester system program to store a command in the shared memory space using a data structure including an index, an ID, and a memory location, and executing instructions of the DUT simulation program to read the command from the shared memory space, access a block of the shared memory space to perform an operation defined by the ID, where a location of the block of shared memory is indicated by the index, and send a completion indicator to the tester system program after the operation is complete.

According to some embodiments, the method includes verifying the data after the operation to test the simulated device, and where the verifying includes comparing the data to an expected result after the operation.

According to some embodiments, the ID indicates that the command includes a program operation, where the operation includes performing the program operation, and where the DUT simulation program writes the data from a block of the shared memory defined by the index to a disk file responsive to the command.

According to some embodiments, the ID indicates that the command includes a read operation, where the operation includes performing the read operation, and further including executing instructions of the DUT simulation program to access one or more disk files to read data and to write the data from the disk file to the host data buffer at a location defined by the index.

According to some embodiments, the instructions of the tester system program and the instructions of the DUT simulation program are executed as separate processes and where the separate processes are managed by the Linux-based operating system.

According to some embodiments, the memory-based communication protocol is a PCIe communication bus protocol.

According to a different embodiment, a system for performing memory-based communication with a simulated device is disclosed. The system includes a processor, a memory coupled to the processor, and a tester system process executed by the processor, where the tester system process is assigned a shared memory address space including a host data buffer, and where the tester system process stores data in the host data buffer and issues commands to a device process by storing commands to the shared memory address space. The device process is executed by the processor for simulating a device, and where the device process includes a controller operable to read data from disk files, write data to the disk files, read the commands from the shared memory address space, and perform operations according to the commands. The commands include a program operation that reads indexed data from the host data buffer and writes the indexed data to the disk files, a read operation that reads data from the disk files and writes the data to the host data buffer according to an index value, and an erase operation that erases one or more of the disk files.

According to some embodiments, the tester system process simulates a tester system and the device process simulates a device under test.

According to some embodiments, the shared memory address space simulates a PCIe bus between the tester system and the device under test.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Figure 1:
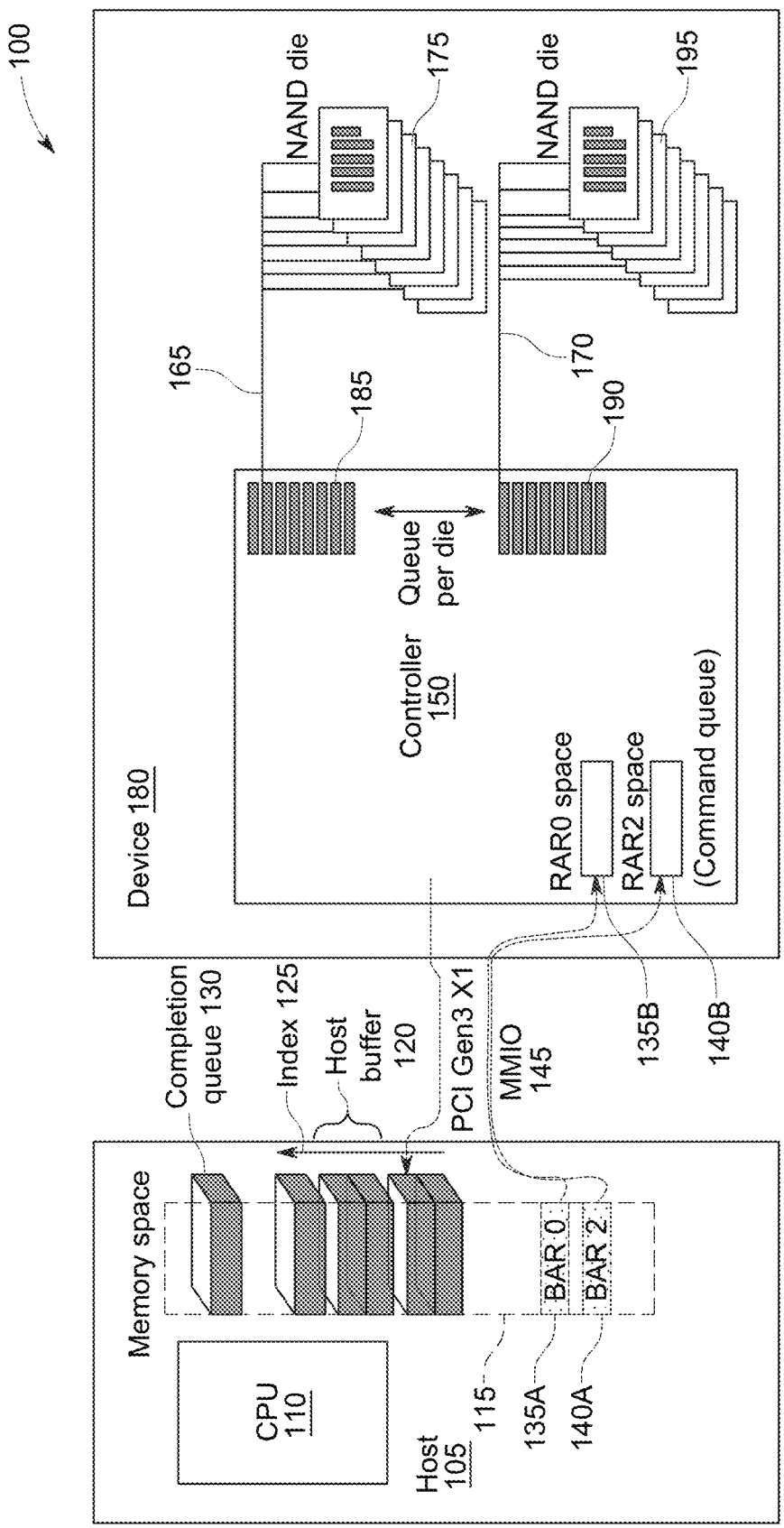
FIG. 1 is a block diagram of an exemplary device testing system including an exemplary host device configured to test a device (e.g., a DUT) using a PCIe data bus depicted according to embodiments of the present invention.

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Portions of the detailed description that follows are presented and discussed in terms of a method. Although steps and sequencing thereof are disclosed in a figure herein (e.g., FIGS. 6 and 7) describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "associating," "identifying," "encoding," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Systems and Methods for Simulation of a Memory-Based Protocol

Embodiments of the present invention provide systems and methods for performing DUT testing that does not depend on the development of the device under test being complete, that can improve the efficiency of test development by testing and debugging the test software on a device simulated in software before the actual DUT is available, and that can be customized to test a vast number of variables to enhance the robustness and scalability of the testing. The testing can be performed at the API level according to the specification of the DUT. By performing testing and debugging earlier in the development process, less debugging and redesign is required of the test software when the actual device is available for testing, leading to an earlier delivery date of the device.

Embodiments of the present invention execute a test program and a software simulator for simulating a NAND memory device under test in communication with a host device (the tester) using a PCIe (peripheral component interconnect express) data bus. PCIe is a serial bus typically including multiple lanes used to perform read and write transactions from an attached device. The operations performed using PCIe are packetized, and the packets typically contains an address and optionally data to be written. The packet is forwarded serially to the target device, and the target device de-packetizes the write order and executes the write operation with the included data. Read operations read data stored in the DUT. For a read operation, a packet is forwarded to a target device, and the target device executes the read operation by creating a special transaction layer packet referred to as a CplD (completion with data) packet which contains the data payload, and a Requester ID is used to route the data payload back to the requestor that issued the read operation. Program operations and erase operations are also frequently issued by the tester.

Memory-based communication protocols map shared memory locations accessible to attached devices (e.g., DUTs) for issuing commands and transferring data between devices, and can be implemented using packet-based protocols, such as the PCIe protocol. The PCIe protocol includes memory-based functionality, and memory-based communication protocols built upon the existing PCIe communication bus may be especially difficult to test because the underlying operations of the DUT are often not apparent during testing. In some cases, the protocol may be defined such that different portions of memory are used to perform different types of functions or memory operations, and the DUT is expected to perform an operation based on commands issued by the host device. Embodiments of the present invention can simulate a memory device (e.g., NAND flash device) using shared memory techniques, such as the mmap shared memory technique implemented by Linux-based operating systems, to simulate a packetized communication protocol, such as PCIe, or a protocol built upon existing PCIe architecture, for testing the memory device. In this case, both the DUT and the PCIe protocol are simulated to facilitate tester software development.

One important design aspect of the PCIe bus is that PCIe devices typically appear to the host as memory-mapped devices. Thus, while the device may receive packetized data from the host, the host interacts with the device by reading and writing from or to particular memory addresses. Therefore, a simulated device can access memory that is also accessible by the host. One aspect of embodiments of the present invention involves simulating a PCIe-based protocol for testing a simulated DUT using shared memory access.

Embodiments of the present invention may be implemented using a Linux-based operating system, where the test program and the simulated device reside as a separate processes controlled by the operating system. Both processes have access to the shared memory address space. Moreover, multiple devices can be simulated as separate processes, and multiple test programs can be executed (e.g., one per simulated device) to enhance the speed and robustness of the testing environment.

Some embodiments described herein include methods or steps for verifying an operation performed by a DUT to determine if the DUT has performed the operation according to the specifications of the device to produce an expected result. For example, according to some embodiments, the DUT writes data to a memory location (a program operation) and reads back the data from the memory location (a read operation) to host memory, and the test program determines if the data was written and/or read successfully. This may be accomplished by comparing the data as read by the DUT to an expected result according to the specifications of the device. Moreover, an erase operation can be verified by confirming that the data to be erased by the erase operation is no longer stored in memory. Other operations may be verified using test equipment, such as probes, to detect and quantify activity of the DUT, and data stored therein. The verifying can be performed as part of a testing or debugging process for detecting and/or correcting defects of the DUT.

With regard to FIG. 1, an exemplary device testing system 100 including an exemplary host device 105 (tester system) configured to test a physical device 180 (e.g., a DUT) using a PCIe data bus 145 is depicted according to embodiments of the present invention. The host device 105 can execute a test program designed for testing the device 180 according to the specific requirements of the device. The PCI data bus 145 is used by the controller 150 of the device to read data from host data buffer 120 and to write data to host data buffer 120 according to commands or operations issued by host device 105. For example, the device 180 can access data in host data buffer 120 by using controller 150 to issue PCIe read requests to host 105 (a program operation), and the device 180 can write data to host data buffer 120 (a read operation) by using controller 150 to issue PCIe write requests to host 105. The host device 105 can issue commands to the controller 150 of device 180 by storing the command in a shared memory address space that is mapped to a physical location of memory stored in the controller 150. For example, the controller 150 can read commands from a base address register (BAR) stored in physical memory of the controller 150 (e.g., in PCIe address space) that is mapped to a location in shared address space 115.

Data is stored in blocks of host data buffer 120 of shared memory space 115, and the blocks of data are indexed according to index values 125. The data can include known patterns of data specifically configured to test device 180. Commands originating from the host 105 typically contain an index value to identify a memory block for use in the command. The index value is read by controller 150 of device 180 to determine a location of data in the host memory buffer 120. When the controller is executing a host command, it will use the data block identified by the index value (either to take data from the block or store data to the block). When the controller 150 completes an operation corresponding to a command issued by the host device 105, the controller 150 sends a completion indicator to host device 105 that is stored in completion queue 130. The commands are stored or queued up as a data structure in BAR2 space (command queue) 140B, and the data structure may include an ID value, an index value, a memory location, and other arguments. When a completion indicator is read by host device 105 for a program command, the corresponding index stored in the host data buffer 120 can be cleared and reused for new data. For a read command, the completion indicator tells the host 105 that the data is available to the host to process.

The host data buffer 120, the index 125, and the completion queue 130 are stored in physical memory of the host device and are accessible by the controller 150 as memory mapped data 115. While the device 180 may receive packetized data from the host, the host can interact with the device by reading and writing from or to particular memory addresses. Therefore, the device 180 can access memory that is also accessible by the host.

According to some embodiments, the controller 150 accesses one or more BARs for storing certain data, such as address translation and mapping, and commands issued by host device 105. The base address registers (e.g., BAR0 135A and BAR2 140A) are physically stored in controller 150 and mapped to shared memory address space 115 on the host device from the PCIe address space accessible to controller 150. For example, BAR0 space 135B can store physical memory addresses in the PCIe address space and is mapped to BAR0 135A on the controller 150. When a program command is received by controller 150, the controller reads the physical memory address associated with the index of the command from BAR0 space 135B to write from PCIe address space to host memory. BAR2 space 140B can be used as a command queue for storing commands issued by the host device 105 before the commands are executed by controller 150. The data in BAR2 140A is physically stored on the controller 150 of device 180 in PCIe address space and is mapped to the shared memory address space 115 on the host device in BAR2 140A.

It is to be appreciated that commands can be received by the controller 150 from host device 105 and stored (queued up in) in a command queue of BAR2 space 140B before the commands are executed, and that the commands can generally be executed in any order. In other words, the commands are not expected to be executed in the same order in which they are issued by host device 105 or read by the controller 150, and the controller 150 can determine an efficient order for executing the commands. Therefore, several commands can be stored in a command queue, and the controller 150 can determine which command to execute next.

The controller 150 is in communication with NAND die 175 and 195 over communication channels 165 and 170, respectively. The communication channels 165 and 170 are operable to communicate with the respective die concurrently. The NAND die store data in planes, blocks, pages, and sectors of the die 175 and 195.

According to some embodiments, each NAND die 175 and 195 is in communication with a respective queue for storing data before the data is written to a die by controller 150. For example, data to be written to NAND die 175 over communication channel 165 can be stored in queue 185, and data to be written to NAND die 195 over communication channel 170 can be stored in queue 190. Data to be written to the NAND die 175 and 195 can be read from host memory 120 by the controller 150 over PCIe bus 145, and data read from NAND die 175 and 195 can be stored in queues 185 and 190 before the data is written to host memory 120.

When a program command is issued to write data to a flash storage location (e.g., die 175 or 195), the host 105 loads data and writes the data into a vacant index location. The host 105 then issues a program command that includes the index location and a storage location. The DUT 180 processes the command, reads the data from the index (e.g., index 125), and stores data in the storage location.

When a read command is issued by the host 105 to read data stored in a DUT 1801, the read command includes an index (e.g., index 125) and a storage location. The data is read from the storage location and written to the index by the DUT.

When an erase operation is issued by the host, the DUT 180 erases data (e.g., one or more disk files) at a storage location indicated in the erase command. A length or size field can be used to indicate how much data (e.g., how many files) is to be erased.

Figure 2:
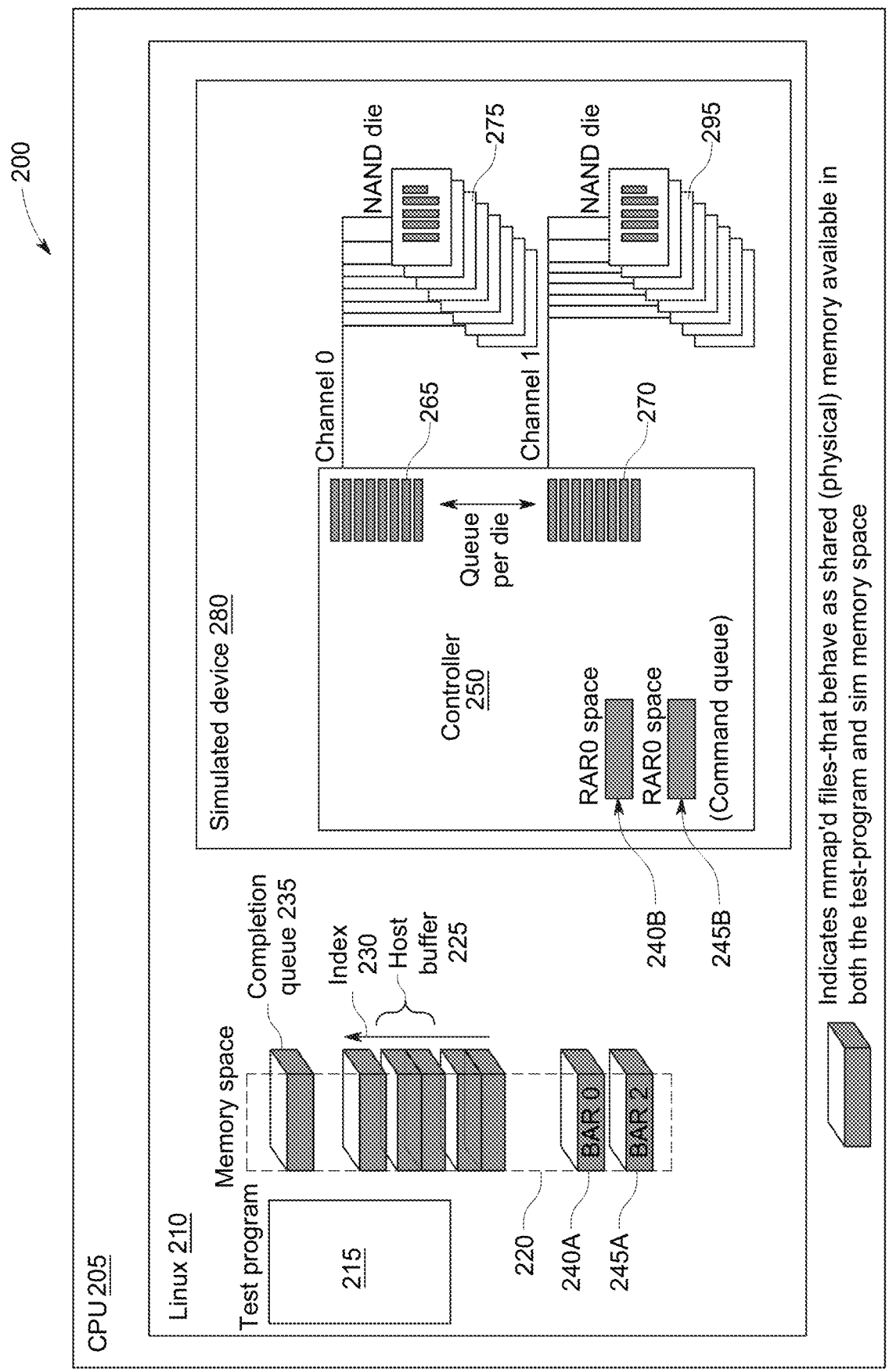
FIG. 2 is a block diagram of an exemplary device testing system including an exemplary test program configured to test a simulated device using a memory-based communication protocol (e.g., PCIe or a communication protocol implemented using PCIe), which is simulated, according to embodiments of the present invention.

With regard to FIG. 2, an exemplary device testing system 200 including an exemplary test program 215 configured to test a simulated device 280 (e.g., a simulated DUT) using a memory-based communication protocol (e.g., PCIe or a communication protocol implemented using PCIe) that is also simulated is depicted according to embodiments of the present invention. The test program 215 generally performs the same functions as host device 105, and the simulated device 280 can be configured to emulate the functionality of device 180 (see FIG. 1). In FIG. 2, both the tester system and the simulated DUT 280 are implemented on different portions of the same Linux-based computer system 205.

Rather than transferring data between the test program 215 and the simulated device 280 using a physical data bus (e.g., PCIe), shared memory address space is utilized to share data between the test program 215 and the simulated device 280 to effectively simulate the PCIe bus. Moreover, the simulated device 280 can use disk files 275 and 295 to simulate NAND die for storing data managed by controller 250. The controller 250 reads host commands from the shared memory space and performs corresponding operations. For example, the controller can access a read command from command queue 245 (including an identified index) in shared memory space 220, read corresponding data from disk files 275 and/or 280, and write the data to host data buffer 225 to the block identified by the index. Program commands and erase commands can also be simulated. In this way, simulated device 280 can be tested using test program 215 to test and debug a DUT (e.g., device 180 in FIG. 1) before the actual device has been fully developed or prototyped. According to some embodiments, simulated device 280 reads data (from program commands) from shared memory address space 220 of test program 215 by issuing a PCIe read request to test program 215, and simulated device 295 writes data (from read commands) to shared memory address space 220 of test program 215 by issuing a PCIe write request to test program 215.

It is appreciated that the test program 215 and the simulated device 280 are executed by CPU 205 using a Linux-based operating system 210. A PCIe data bus is simulated in software for transferring data and commands between the test program 215 and the simulated device 280 using mapped files (e.g., files mapped using mmap). The mapped files behave as shared physical memory and are available in the memory space of both the test program 215 and the simulated device 280. Completion queue 235, index 230, host data buffer 225, and any BARs can be implemented as shared physical memory using mapped files. In this way, the data in shared memory space 220 is accessible to both the test program 215 and the simulated device 280. For example, a command can be issued by test program 215 by writing a command to BAR2 245A in shared memory address space 220, where the memory space of BAR2 245A is mapped to PCIe address space and physically stored on the controller in BAR2 space 245B, and the controller 250 reads the command from BAR2 space 245B to perform a corresponding operation.

Shared memory address space 220 is accessed by the controller 250 of the device to read data from host data buffer 225 (program commands) and to write data to host data buffer 225 (read commands) according to commands issued by test program 215. Data is stored in host data buffer 225 of shared memory address space 220, and the data is indexed according to index values 230. The index value is read by controller 250 of device 280 to determine a location of data in the host memory buffer 225 associated with the last command. When the controller 250 completes an operation corresponding to a command issued by the test program 215, the controller 250 sends a completion indicator to test program 215 that is stored in completion queue 235. The completion indicator identifies the command with which it is associated. The commands issued by the test program 215 are stored as a data structure in shared memory address space 220 (e.g., in a base address register), and the data structure may include an ID value, an index value, a memory location, and other arguments (e.g., length, size, etc.). When a completion indicator is read by test program 215, the corresponding index stored in the host data buffer 225 can be cleared and reused for new data if the command is a program command. If the command is a read command, then the host is able to access the data upon receiving the completion indicator.

According to some embodiments, the controller 250 accesses one or more base address registers (BARs) for accessing certain data, such as address translation and mapping, and commands issued by test program 215. The base address registers (e.g., BAR0 space 240B and BAR2 space 245B) are mapped to a shared memory address space of test program 215 and physically stored in controller 250 in PCIe address space incident to a read command. If the command is a program command, then the controller will use the index value to determine the memory address from which to read data.

BAR0 space 240B can store physical memory addresses mapped to the PCIe address space of controller 250 for accessing data in host data buffer 225. When a program command is received by controller 250, the controller reads the physical memory address associated with the index of the command from BAR0 space 240B to determine the physical memory address for writing to host memory.

BAR2 245A can be used as a command queue for storing commands issued by test program 215 before the commands are executed by controller 250. It is to be appreciated that commands can be received by the controller 250 from test program 215 and stored in a command queue of BAR2 space 245B before the commands are executed, and that the commands can be executed in any order. In other words, the commands are not expected to be executed in the same order in which they are issued by test program 215 or read by the controller 250, and the controller 250 can determine the order in which commands are executed.

The controller 250 uses disk files 275 and 295 for storing data to simulate NAND die (e.g., NAND die 175 and 195 in FIG. 1). The disk files can be written in a way that emulates blocks of NAND flash, where each file is associated with a specific block and contains pages and sectors of data. The files representing blocks can also be associated with a plane of a respective NAND die. When a command is issued by test program 215, a memory location of data stored in disk files 275 or 295 can be included in the arguments of the command to indicate which data the controller 250 should access (read or write) responsive to the command. In this way, the simulated device 280 can emulate a DUT for reading from (and writing to) NAND flash before the DUT itself is able to be physically produced and tested using traditional means.

According to some embodiments, data to be written to disk files 275 is stored in queue 265, and data to be written to disk files 295 is stored in queue 270. The data to be written to the disk files 275 and 295 may be read from host memory 225 by the controller 250 and initially written to the queues 265 and 270. Moreover, data read from disk files 275 and 295 by controller 250 can be stored in queues 265 and 270 before the data is written to host memory 225. Using the simulated DUT 280 and by also simulating the PCIe bus via the memory mapping technique described above, the present invention allows an environment wherein the test program 215 can be developed and debugged before the actual physical DUT is available.

Figure 3:
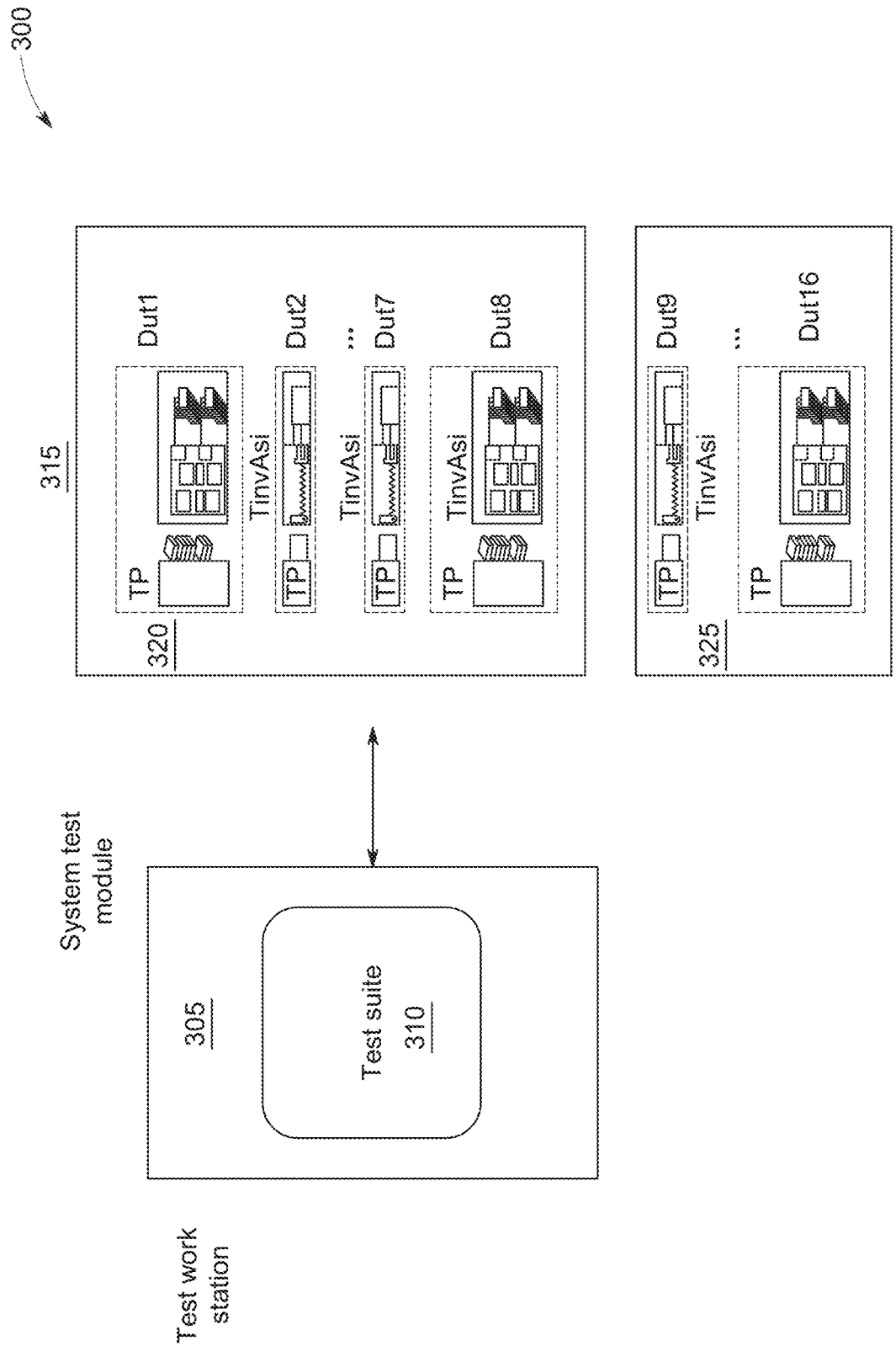
FIG. 3 is a block diagram of an exemplary testing environment for testing multiple simulated devices simultaneously depicted according to embodiments of the present invention.

With regard to FIG. 3, an exemplary testing environment 300 for testing multiple simulated devices simultaneously is depicted according to embodiments of the present invention. A test work station 305 executes a test suite 310 that provides a user interface, software functions, and a control API for interfacing with system test module 315. The system test module 315 has multiple embedded processors and each processor executes a Linux-based operating system to provide testsites for testing simulated devices.

Each testsite is assigned unique memory mapped areas (e.g., mmapped memory) for simulating memory-based communication protocols to test the DUTs. For example, Testsite 320 can execute multiple test programs to test up to 8 simulated DUTs simultaneously (e.g., Dut1-Dut8), where each test program and each simulated DUT is executed as separate process by the Linux-based operating system. Testsite 325 can also execute 8 simulated DUTs simultaneously (e.g., DUT9-DUT16) and corresponding test programs. The system test module 315 can include more or fewer embedded processors within the scope of embodiments of the present invention. For example, the system test module 315 can include up to 96 embedded processors executing Linux-based operating systems to concurrently test up to 768 DUTs. The testsites 320 and 325 can execute multiple instances of the test program 215 and the simulated device 280 depicted in FIG. 2, for example.

The test suite 310 can include functionality to change parameters and configurations for testing the DUTs to simulate different operating conditions. For example, one set of DUTs can be tested using one configuration, another set of DUTs can be tested using a different configuration, and the results from the DUTs can be compared to determine how the configurations produce different results. Moreover, each individual DUT can be configured to simulate different operating conditions for quickly detecting errors and performing rapid debugging.

According to some embodiments, the test suite 310 can introduce random or pseudo-random delays (e.g., read or write delays) for performing stress testing of the simulated device.

Figure 4:
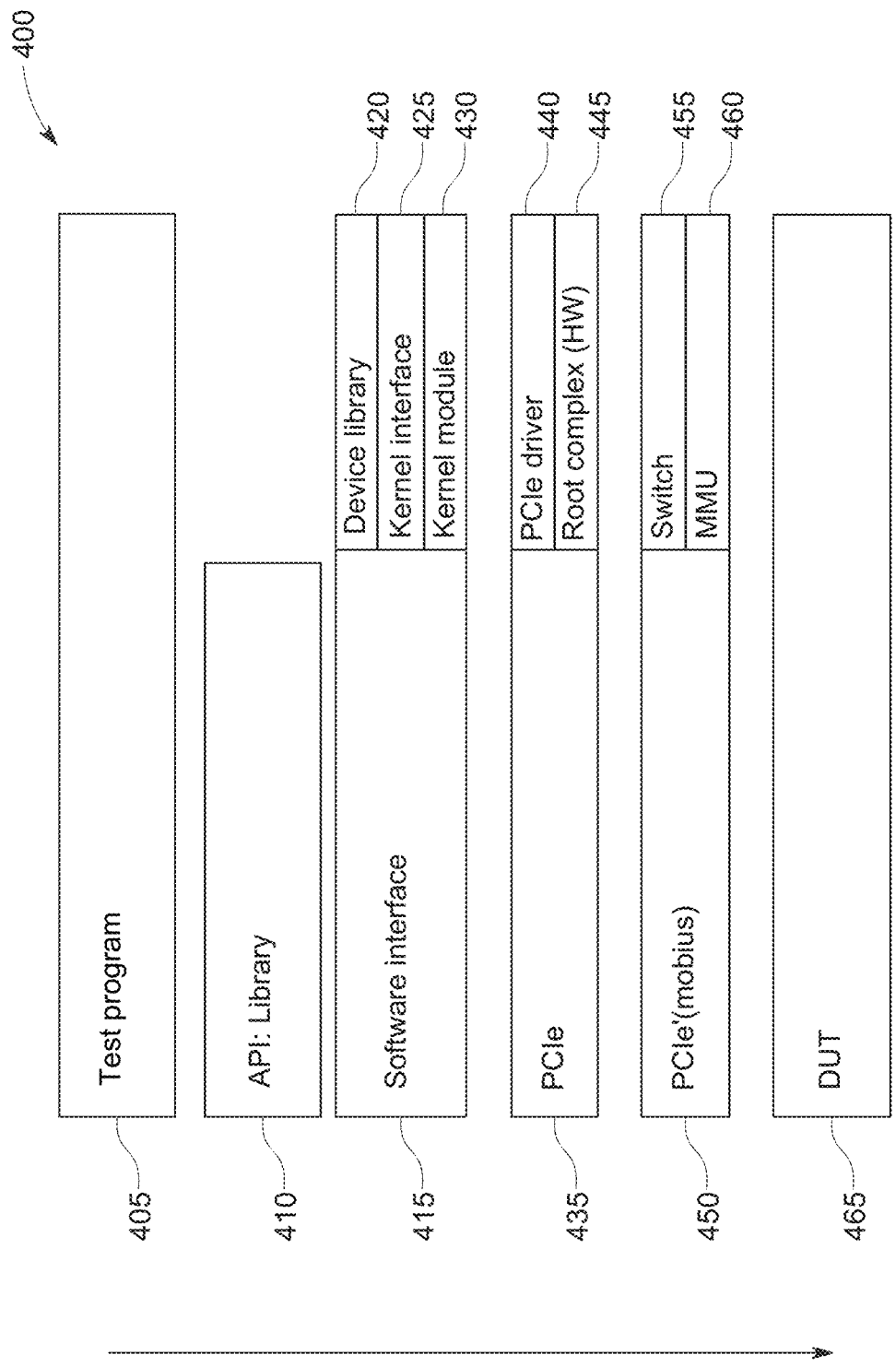
FIG. 4 is a data flow diagram depicting an exemplary software hierarchy for testing a physical DUT according to embodiments of the present invention.

With regard to FIG. 4, a data flow diagram 400 depicting an exemplary software hierarchy or stack for testing a physical device under test 465 is depicted for the system as shown in FIG. 1. The hierarchy includes a test program 405 executed by a host system and configured to perform device testing for a specific device (DUT) 465. The test program 405 is often provided by the manufacturer of the device 465 according to the specific requirements for testing the device 465. The API library 410 includes an access library that provides functions for test program 405 that are used to control the hardware of the device 465. The functions of API library 410 are called by the test program 405 and executed via software interface 415. The software interface 415 is a device protocol operable to communicate with a communication interface of the device 465 (e.g., PCIe) and includes a machine-specific device library 420, a kernel interface 425, and a Linux device driver (kernel module) 430. The software interface 415 communicates over interface 435 via device driver 440, and a root complex device 445 connects the processor and memory subsystem of the host system to the PCIe switch fabric 455 of the PCIe component 450 of the device 465. A memory management unit 460 facilitates memory access between the main memory of the host system and the device 465 over interface 435.

Figure 5:
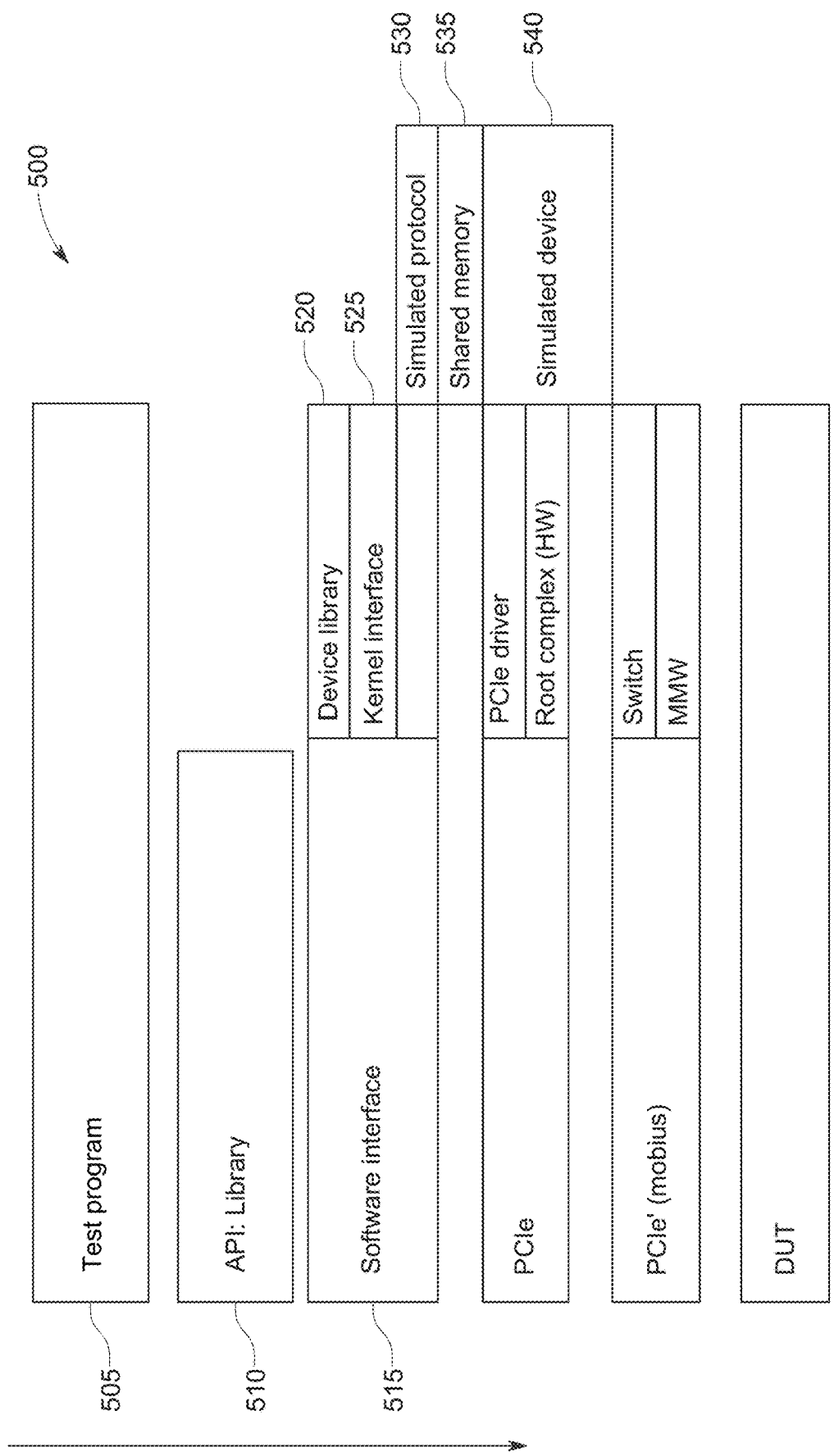
FIG. 5 is a data flow diagram depicting an exemplary software hierarchy for simulating a memory-based communication protocol to test a simulated device depicted according to embodiments of the present invention.

With regard to FIG. 5, a data flow diagram 500 depicts an exemplary software hierarchy or stack for simulating a memory-based communication protocol to test a simulated device 540 according to embodiments of the present invention for the system as showing in FIG. 2. Similar to data flow diagram 400, the functions of API library 510 are called by the test program 505 and executed via software interface 515. The software interface 515 interfaces with simulated device 540 and includes a machine-specific device library 520 and a kernel interface 525. The kernel interface 525 interacts with a simulated communication protocol 530 that can emulate a memory-based communication protocol, such as PCIe, or a memory-based protocol built upon PCIe.

Interactions between the simulated protocol 530 and the simulated device 540 are facilitated by shared-memory techniques of a Linux-based operating system, such as shared memory 535 implemented using mmap. Using shared-memory 535, the host device executing test program 505 interacts with the simulated device 540 by reading and writing data using particular memory addresses. Therefore, embodiments of the present invention provide a data flow 500 for testing a simulated device before the development of the device is complete so that the tester software can be developed and debugged. This can improve the efficiency of production development of the tester software by testing and debugging the device simulated in software before the physical device is available, and that the tester software can be customized to test a vast number of variables to enhance the robustness and scalability of the testing.

Figure 6:
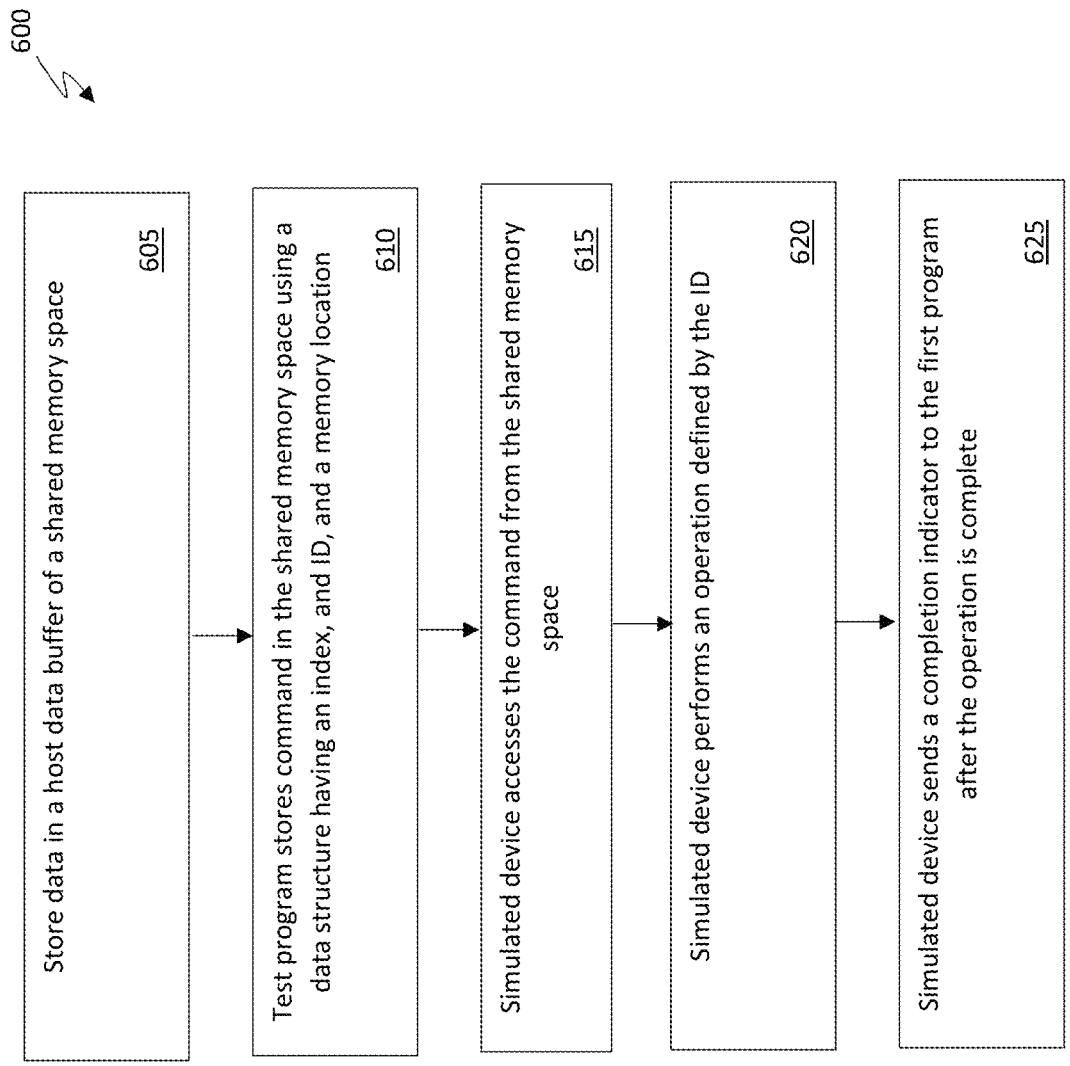
FIG. 6 is a flow chart of an exemplary sequence of computer implemented steps for performing an operation to test a simulated device depicted according to embodiments of the present invention.

With regard to FIG. 6, an exemplary sequence of computer implemented steps 600 for testing a simulated device is depicted according to embodiments of the present invention. The computer implemented steps 600 may be performed using a Linux-based operating system, where a test program and the simulated device program reside as a separate programs or processes controlled by the operating system. Both processes have access to a shared memory address space. Moreover, multiple devices can be simulated as separate processes, and multiple test programs can be executed (e.g., one per simulated device) to enhance the speed and robustness of the testing environment.

At step 605, a known pattern of data is stored in specific locations of host memory (e.g., a host data buffer) in the shared memory space accessible to both a simulated device and a test program that executes instructions to test the simulated device. At step 610, the test program stores a command in the shared memory space. The command is stored in a data structure that includes fields for an index, and ID, a memory location, and optionally other arguments such as a data length or size. According to some embodiments, the command is stored in a BAR that is memory mapped to be accessible to both the test program and the simulated device for queueing commands for execution by a controller of the simulated device, and the queued commands may be executed in any order.

At step 615, the simulated device accesses the command from the data structure in the shared memory space. Accessing the command can include reading the index, the ID, the memory location, and other arguments from the data structure.

At step 620, the simulated device performs an operation defined by the command ID and using the memory location indicated by the index. Step 620 typically includes accessing data in the shared memory address space. Step 620 can further include the simulated device accessing a shared memory location (e.g., a BAR) to lookup a physical address mapping that maps the location of the data indicated by the index to a physical memory location of host memory. As described more fully below, the operation can include a program operation, a read operation, an erase operation, etc. For example, the operation can include reading or writing data to disk files in a manner that simulates reading and writing to one or more die of flash memory (e.g., NAND flash). The operation can further include writing data to one or more queues before the data is written to the disk files.

For a host-issued program operation, the ID in the data structure indicates that the operation includes performing a program operation using data pre-stored in a location of host memory indicated by the index of the data structure, and step 620 further includes the controller of the simulated device making a read request (e.g., a PCIe read request) for data in host memory according to a memory location indicated by the index. The controller of the simulated device obtains the data from host memory and writes the data to one or more disk files at a location also indicated by the memory location in the data structure. A length or size field in the data structure can indicate how much data is to be read from host memory and written to the disk files. According to some embodiments, the location of the data to write is indicated by the index, and the location is translated into a physical memory location in PCIe address space according to a memory mapping defined the shared memory space (e.g., a BAR). According to some embodiments, the data to be written to the disk files is first written to a queue before being written to the disk files. At the completion of the program command, the DUT issues a completion indicator so that the host can free the data block.

For a read operation, the ID in the data structure indicates that the operation includes performing a read operation to obtain data stored in one or more disk files of the device, and step 620 further includes the controller of the simulated device obtaining data from one or more disk files at a location indicated by the memory location in the data structure, and further, writing the data (e.g., issuing a PCIe write request) to a location in host memory according to the provided index. A length or size field in the data structure can indicate how much data is to be read from the disk files and written to host memory. According to some embodiments, the memory location for writing the data indicated by the index is translated into a physical memory location in PCIe address space according to a memory mapping defined in the shared memory space (e.g., in a BAR). At the completion of the read operation, a completion indicator informs the host that the data is available at the identified block.

For an erase operation, the ID in the data structure indicates that the operation includes performing an erase operation to erase data, and step 620 further includes the controller of the simulated device erasing one or more disk files at a location indicated by the memory location in the data structure. A length or size field in the data structure can indicate how much data (e.g., how man files) is to be erased. According to some embodiments, each disk file represents a block of NAND flash memory, and the erase operation is performed on a block-by-block (file-by-file) basis. According to some embodiments, the erase operation includes deleting one or more disk files from memory.

At step 625, the simulated device sends a completion indicator to the test program indicating that the operation is complete. The completion indicator can be stored in a completion queue implemented in a BAR of a shared memory space. Moreover, for program commands, step 625 can include freeing the respective index location after the command has been completed. For read commands, the completion indicator informs the host that the data is ready to be read.

Figure 7:
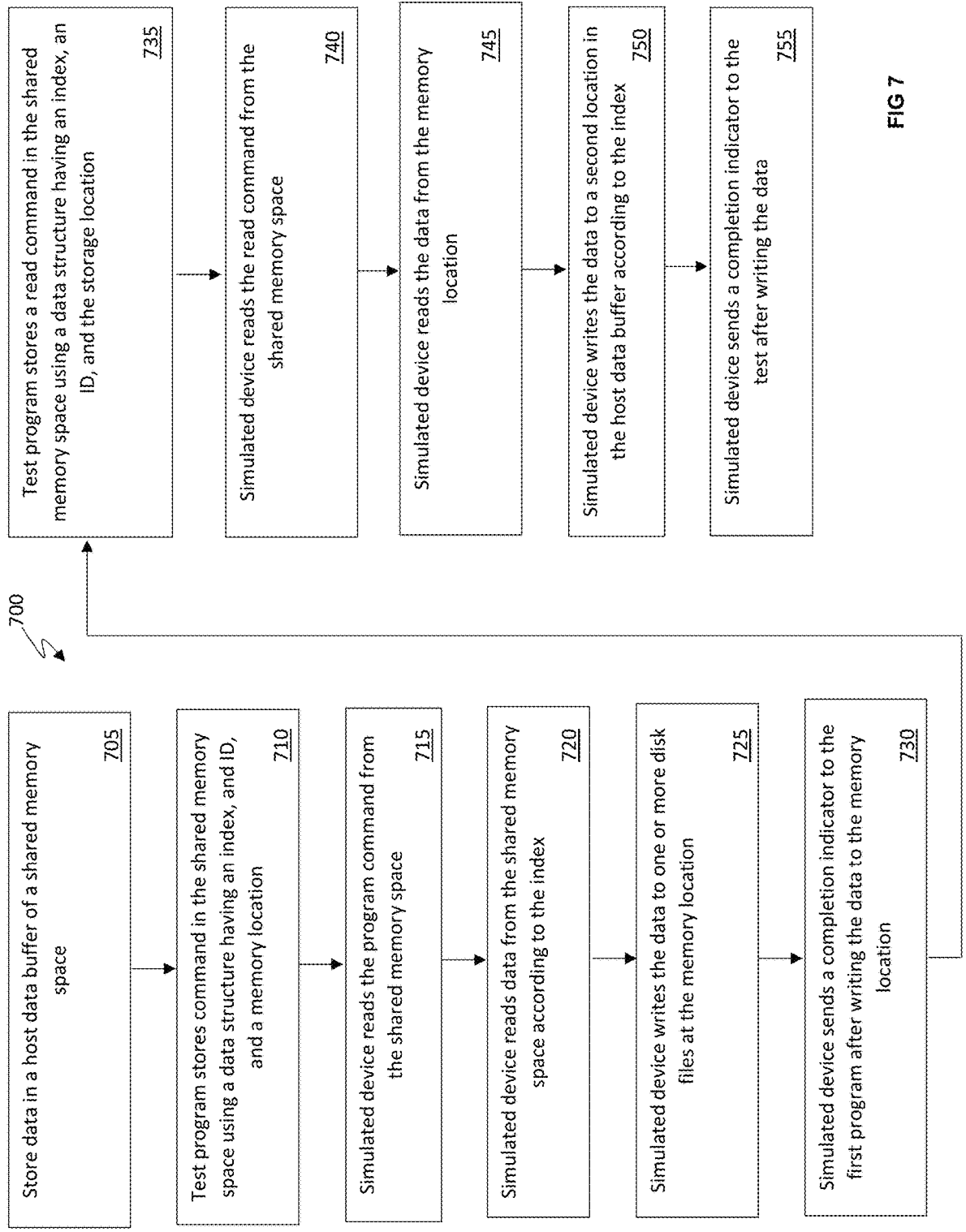
FIG. 7 is a flow chart of an exemplary sequence of computer implemented steps for performing a program operation and a read operation to test a simulated device depicted according to embodiments of the present invention.

With regard to FIG. 7, an exemplary sequence of computer implemented steps 700 for testing a simulated device is depicted according to embodiments of the present invention. The computer implemented steps 700 may be performed using a Linux-based operating system, where a test program and the simulated device program reside as separate programs or processes controlled by the operating system. Both processes have access to a shared memory space. Moreover, multiple devices can be simulated as separate processes, and multiple test programs can be executed (e.g., one per simulated device) to enhance the speed and robustness of the testing environment.

At step 705, known patterns of data are stored in specific locations of host memory (e.g., a host data buffer) in the shared memory space accessible to both the simulated device and the test program that executes instructions to test the simulated device.

At step 710, the host stores data into a memory block to be programmed to the DUT, and the test program stores a program command in the shared memory space. The command is stored in a data structure that includes fields for an index, and ID, a memory location, and optionally other arguments such as a data length or size. According to some embodiments, the command is stored in a BAR accessible to both the test program and the simulated device for storing commands before execution by a controller of the simulated device, and the stored commands may be executed in any order.

At step 715, the simulated device accesses the program command from the shared memory space. Accessing the command can include reading the index, the ID, the memory location, and other arguments from the data structure in the shared memory space.

At step 720, the controller of the simulated device reads data from the shared memory space that was stored there at step 710. The location of the data read by the simulated device is indicated by the index. The controller can obtain the data from host memory by issuing a PCIe read request to the test program, for example. Step 720 can further include the simulated device accessing a shared memory location (e.g., a BAR) to lookup a physical address mapping that maps the location of the data indicated by the index to a physical memory location of host memory.

At step 725, the simulated device writes the data read in step 720 to one or more disk files at a location indicated by the memory location stored in the data structure. According to some embodiments, the data to be written to the disk files is first written to a queue before being written to the disk files.

At step 730, the simulated device sends a completion indicator to the test program indicating that the program operation is complete. The completion indicator can be stored in a completion queue implemented in a BAR of a shared memory space. Moreover, step 730 can include freeing the respective index location after the program command has been completed.

Steps 735-750 can optionally be performed to read back the data written to the simulated device and to verify that the program operation was performed without error.

At step 735, the test program stores a read command in the shared memory space using a data structure having an index, an ID indicating that the command includes a read operation, and the memory location where the data was written in step 725.

At step 740, the simulated device accesses the read command from the shared memory space. Accessing the command can include reading the index, the ID, the memory location, and other arguments from the data structure in the shared memory space.

At step 745, the simulated device reads the data from the memory location responsive to the read command.

At step 750, the simulated device writes the data to a second location in the host data buffer according to the index. For example, the simulated device can issue a PCIe write request to write the data to the host data buffer. According to some embodiments, the location to write to is indicated by the index, and the location is translated into a physical memory location in PCIe address space according to a memory mapping defined in a BAR stored in the shared memory space.

At step 755, the simulated device sends a completion indicator to the test program indicating that the write operation is complete. The completion indicator can be stored in a completion queue implemented in a BAR of a shared memory space. Moreover, step 755 can include freeing the respective index location after the read command has been completed.

Figure 8:
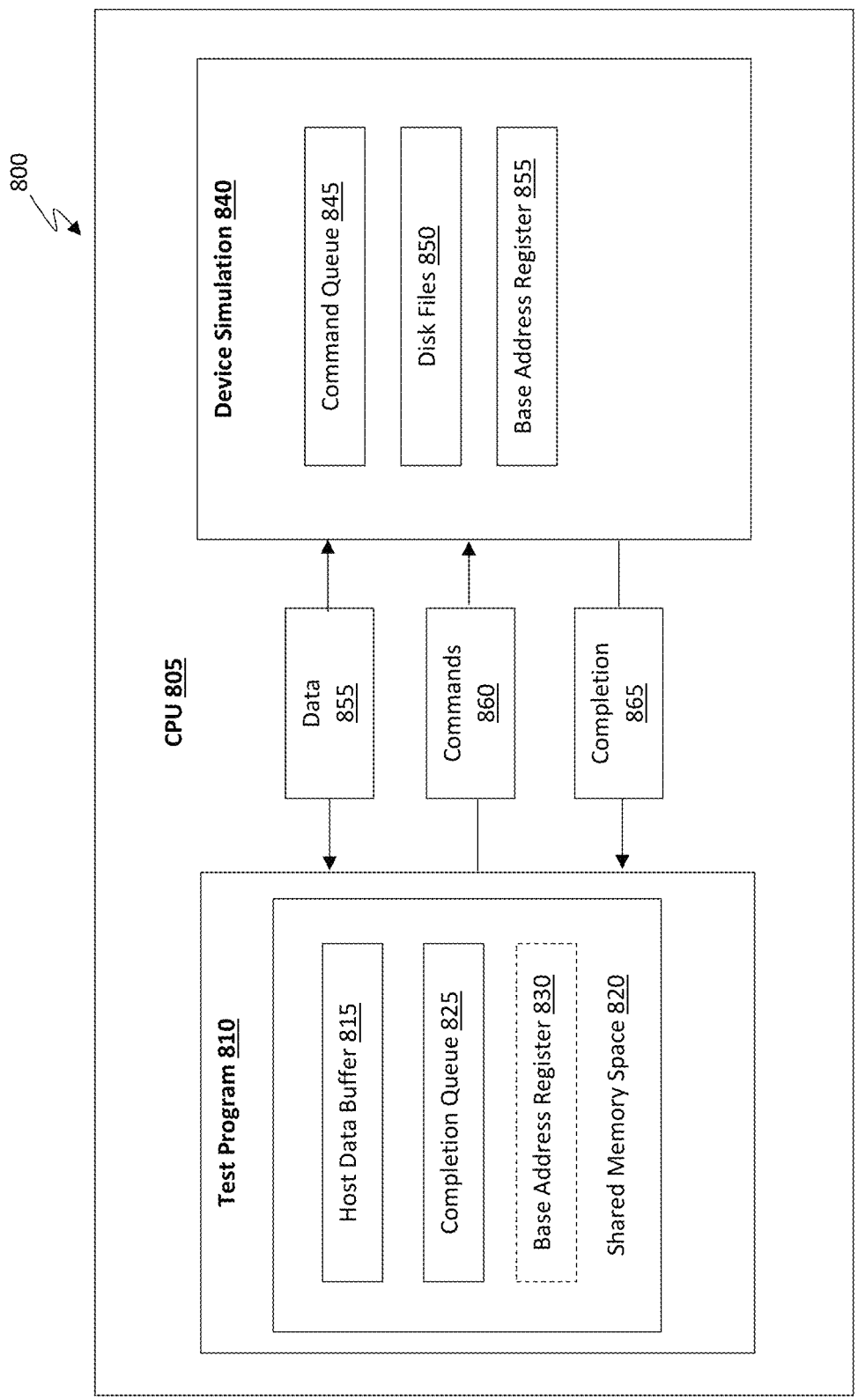
FIG. 8 is a block diagram and data flow diagram for simulating an exemplary memory-based communication protocol to test a simulated device depicted according to embodiments of the present invention.

With regard to FIG. 8, a block diagram and data flow diagram 800 for simulating an exemplary memory-based communication protocol to test a simulated device 840 is depicted according to embodiments of the present invention. Test program 810 and device simulation 840 are executed by CPU 805 within a Linux-based operating system. Test program 810 and device simulation 840 may be executed as separate processes or programs by CPU 805 and both can access a shared memory address space 820 including host data buffer 815. Device simulation 840 can send data 855 to test program 810 responsive to a read command, and device simulation 840 can write data 855 obtained from host data buffers 815 to one or more disk files 850 responsive to a program command. After an operation is complete, the device simulation 840 sends a completion indicator 865, and the completion indicator can be stored in completion queue 825.

The device simulation 840 performs operations (e.g., program, read, erase) responsive to command 860 issued by test program 810. The commands can be stored in a shared or mapped memory space that is accessible by both the test program 810 and the device simulation 840, such as base address register 830. Base address register 855 is implemented in the memory of device simulation 840 in PCIe address space and is mapped to the memory space (base address register 830) of test program 810. The commands can be stored as a data structure including fields for an ID, an index, a memory location, and other arguments. Commands issued by the test program 810 can be stored in command queue 845, and the device simulation 840 can execute the commands in any order.

Exemplary Computer System

Embodiments of the present invention are drawn to electronic systems for performing simulated DUT testing that does not depend on the development of the device being complete, that can improve the efficiency of developing testing and debugging software before the actual DUT is available, and that can be customized to test a vast number of variables to enhance the robustness and scalability of the testing. Some embodiments execute a test program and a software simulator for simulating a NAND memory device in communication with a host device using a PCIe (peripheral component interconnect express) data bus. The following discussion describes one such exemplary electronic system or computer system that can be used as a platform for implementing embodiments of the present invention.

Figure 9:
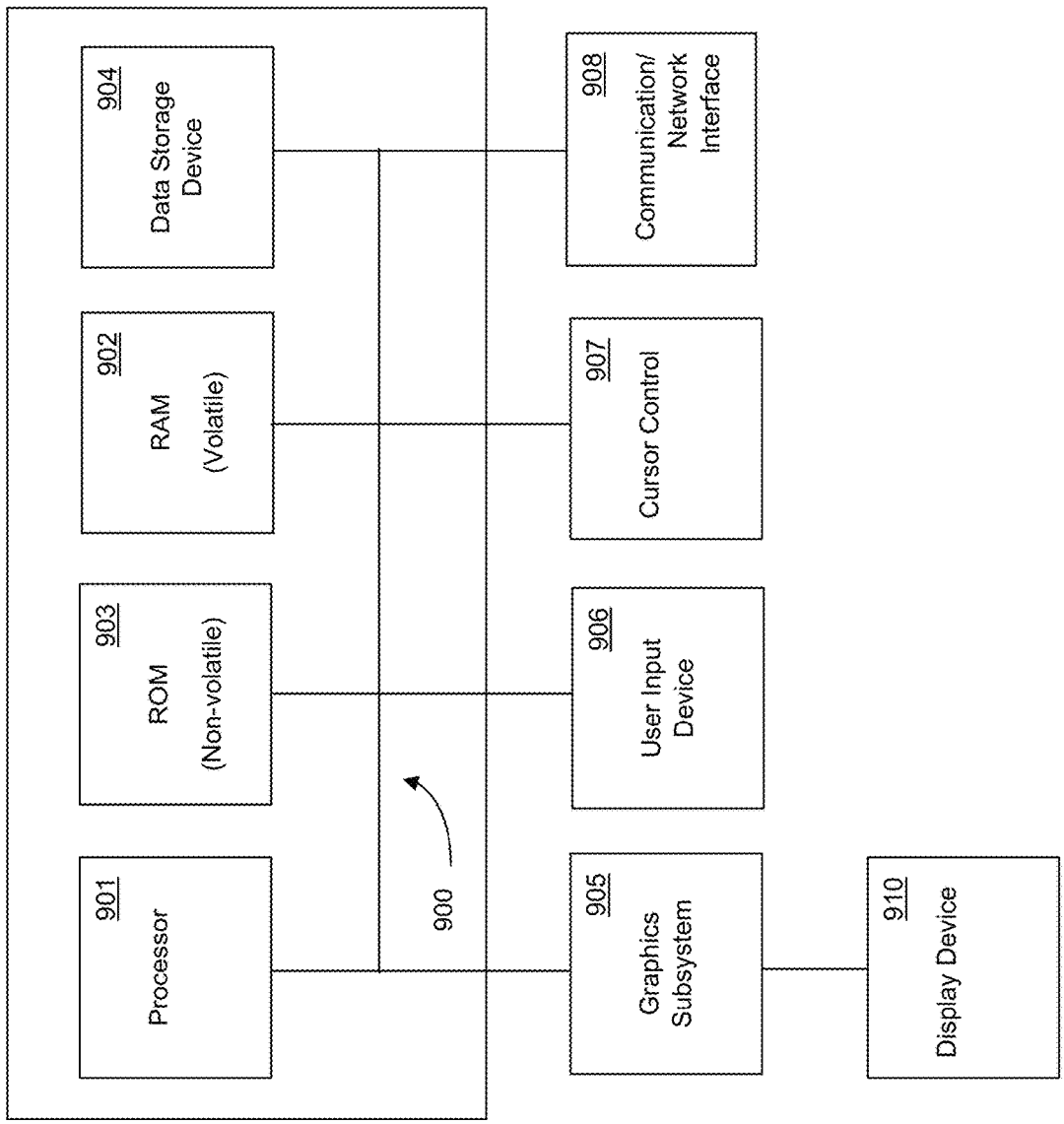
FIG. 9 depicts an exemplary computer platform upon which embodiments of the present invention may be implemented.

In the example of FIG. 9, the exemplary computer system 912 (e.g., an agent system or supervisor system) includes a central processing unit (CPU) 901 for running software applications and optionally an operating system (e.g., a Linux or a Linux-based operating system). Random access memory 902 and read-only memory 903 store applications and data for use by the CPU 901. Moreover, memory space of computer system 912 (e.g., memory space of random access memory 902) can be used to map shared memory locations accessible to attached devices (e.g., DUTs) for issuing commands and transferring data between devices, and can be implemented using packet-based protocols, such as PCIe. In some cases, the protocol may be defined such that different portions of memory are used to perform different types of functions or memory operations, and the DUT is expected to perform an operation based on commands issued by the host device. In this way, embodiments of the present invention can simulate a memory device (e.g., NAND flash device) using shared memory techniques to simulate a packetized communication protocol for testing memory devices.

Data storage device 904 provides non-volatile storage for applications and data and may include fixed disk drives, removable disk drives, flash memory devices, and CD-ROM, DVD-ROM or other optical storage devices. The optional user inputs 906 and 907 comprise devices that communicate inputs from one or more users to the computer system 912 (e.g., mice, joysticks, cameras, touch screens, and/or microphones).

A communication or network interface 908 allows the computer system 912 to communicate with other computer systems, devices, networks, or devices via an electronic communications network, including wired and/or wireless communication such as USB or Bluetooth, and including an Intranet or the Internet (e.g., 802.11 wireless standard). The optional display device 910 may be any device capable of displaying visual information in response to a signal from the computer system 912 and may include a flat panel touch sensitive display, for example. The components of the computer system 912, including the CPU 901, memory 902/903, data storage 904, user input devices 906, and graphics subsystem 905 may be coupled via one or more data buses 900.

In the embodiment of FIG. 9, an optional graphics subsystem 905 may be coupled with the data bus and the components of the computer system 912. The graphics system may comprise a physical graphics processing unit (GPU) 905 and graphics/video memory. Graphics sub-system 905 outputs display data to optional display device 910. The display device 910 may be communicatively coupled to the graphics subsystem 905 using HDMI, DVI, DisplayPort, VGA, etc.

Some embodiments may be described in the general context of computer-executable instructions, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Embodiments of the present invention are thus described. While the present invention has been described in particular embodiments, it should be appreciated that the present invention should not be construed as limited by such embodiments, but rather construed according to the following claims.

What is claimed is:

1. A method of simulating a memory-based communication protocol for testing a simulated device, the method comprising:
   storing data in a host data buffer implemented in a shared memory space;
   executing instructions of a test program to store a command in the shared memory space using a data structure comprising an operation identifier and a memory location; and
   executing instructions of a device under test (DUT) simulation to:
   read the command from the memory location; and
   access a block of the shared memory space to perform an operation defined by the operation identifier.

2. The method as described in claim 1, wherein the operation identifier indicates that the command comprises a program operation, wherein the access a block of the shared memory space comprises reading the block to obtain data for writing to the memory location, wherein the operation comprises performing the program operation, and further comprising the DUT simulation writing the data to a disk file responsive to the command.

3. The method as described in claim 2, further comprising verifying the data after the operation to test the simulated device for errors after the program operation.

4. The method as described in claim 3, wherein the verifying comprises comparing the data to an expected result.

5. The method as described in claim 1, wherein the operation identifier indicates that the command comprises a read operation, wherein the access a block of the shared memory space comprises storing data read from the memory location, wherein the operation comprises performing the read operation, and further comprising executing instructions of the DUT simulation to access one or more disk files to read data at the memory location and store to the host data buffer in the block of shared memory.

6. The method as described in claim 1, wherein the instructions of the test program and the instructions of the DUT simulation are executed as separate processes managed by an operating system.

7. The method as described in claim 6, wherein the instructions of test program and the instructions of the DUT simulation are executed by a same processor.

8. The method as described in claim 1, wherein the command is stored in a base address register of the shared memory space.

9. The method as described in claim 1, wherein the shared memory space comprises memory-mapped files that emulate physical memory.

10. The method as described in claim 9, wherein the memory-mapped files comprise files mapped using mmap.

11. The method as described in claim 1, wherein the shared memory space comprises memory-mapped files that emulate NAND flash memory.

12. The method as described in claim 1, wherein the memory-based communication protocol utilizes a communication bus protocol compliant with PCIe.

13. A method of simulating a memory-based communication protocol for testing program operations of a simulated device, the method comprising:
    storing data in a host data buffer, wherein the host data buffer is implemented in a shared memory space;
    executing instructions of a test program to store a program operation in the shared memory space;
    executing instructions of a device under test (DUT) simulation to:
    access the program operation in the shared memory space;
    read data from a block of the shared memory space; and
    write the data to one or more disk files;
    executing instructions of the test program to store a read operation in the shared memory space; and
    executing instructions of the DUT simulation to:
    read the data from the one or more disk files; and
    write the data to a block of the host data buffer.

14. The method as described in claim 13, further comprising verifying the data after the read operation to test the simulated device for errors, wherein the verifying comprises comparing the data to an expected result.

15. The method as described in claim 13, wherein the instructions of the DUT simulation are executed to send a completion indicator to the test program after writing the data to the memory location, wherein the completion indicator is stored in a queue managed by the test program.

16. The method as described in claim 13, wherein the program operation comprises a memory location of a disk, and wherein the memory location is implemented as a disk file to simulate flash memory.

17. A system for simulating a device under test (DUT), the system comprising:
    a processor executing an operating system; and
    a memory in communication with the processor that provides a shared memory space for a test program and a DUT simulation program, wherein instructions of the test program and the DUT simulation program are executed by the processor, and wherein the processor performs a method of simulating a memory-based communication protocol for testing a simulation of the DUT, the method comprising:
    storing data in a host data buffer, wherein the host is a tester system, and wherein the host data buffer is implemented in the shared memory space;

executing instructions of the test program to store a command in the shared memory space using a data structure comprising an index, an operation identifier, and a memory location; and executing instructions of the DUT simulation program to:
  read the command from the shared memory space;
  access a block of the shared memory space to perform an operation defined by the ID, wherein a location of the block of shared memory is indicated by the index; and
  send a completion indicator to the test program after the operation is complete.

18. The system as described in claim 17, wherein the method further comprises verifying the data after the operation to test the simulated device, and wherein the verifying comprises comparing the data to an expected result after the operation.

19. The system as described in claim 17, wherein the operation identifier indicates that the command comprises a program operation, wherein the operation comprises performing the program operation, and wherein the DUT simulation program writes the data from a block of the shared memory defined by the index to a disk file responsive to the command.

20. The system as described in claim 17, wherein the operation identifier indicates that the command comprises a read operation, wherein the operation comprises performing the read operation, and further comprising executing instructions of the DUT simulation program to access one or more disk files to read data and to write the data from the disk file to the host data buffer at a location defined by the index.

21. The system as described in claim 17, wherein the instructions of the test program and the instructions of the DUT simulation program are executed as separate processes and wherein the separate processes are managed by an operating system executed by the processor.

22. The system as described in claim 17, wherein the memory-based communication protocol is a PCIe communication bus protocol.

23. A system for performing memory-based communication with a simulated device, the system comprising:
  a processor;
  a memory coupled to the processor; and
  a tester system process executed by the processor, wherein the tester system process is assigned a shared memory address space including a host data buffer, and wherein the tester system process stores data in the host data buffer and issues commands to a device process by storing commands to the shared memory address space,
  wherein the device process is executed by the processor for simulating a device, and wherein the device process comprises a controller operable to:
    read data from disk files;
    write data to the disk files;
    read the commands from the shared memory address space;
    perform operations according to the commands, wherein the commands comprise:
      a program operation that reads indexed data from the host data buffer and writes the indexed data to the disk files;
      a read operation that reads data from the disk files and writes the data to the host data buffer according to an index value; and
      an erase operation that erases one or more of the disk files.

24. The system as described in claim 23, wherein the tester system process simulates a tester system and the device process simulates a device under test.

25. The system as described in claim 24, wherein the shared memory address space simulates a PCIe bus between the tester system and the device under test.

* * * * *